United States Patent
Iwaki et al.

(10) Patent No.: US 11,451,210 B2
(45) Date of Patent: Sep. 20, 2022

(54) ACOUSTIC WAVE DEVICE, FILTER, AND MULTIPLEXER

(71) Applicant: TAIYO YUDEN CO., LTD., Tokyo (JP)

(72) Inventors: Masafumi Iwaki, Tokyo (JP); Yoshio Satoh, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 954 days.

(21) Appl. No.: 16/214,968

(22) Filed: Dec. 10, 2018

(65) Prior Publication Data

US 2019/0238111 A1    Aug. 1, 2019

(30) Foreign Application Priority Data

Jan. 26, 2018 (JP) .............................. JP2018-011861

(51) Int. Cl.
| | |
|---|---|
| *H03H 9/02* | (2006.01) |
| *H03H 9/145* | (2006.01) |
| *H03H 9/64* | (2006.01) |
| *H03H 9/72* | (2006.01) |
| *H03H 9/25* | (2006.01) |
| *H01L 41/047* | (2006.01) |

(52) U.S. Cl.
CPC .... *H03H 9/02818* (2013.01); *H03H 9/02559* (2013.01); *H03H 9/02637* (2013.01); *H03H 9/02866* (2013.01); *H03H 9/14541* (2013.01); *H03H 9/25* (2013.01); *H03H 9/6483* (2013.01); *H03H 9/6489* (2013.01); *H03H 9/725* (2013.01); *H01L 41/0477* (2013.01)

(58) Field of Classification Search
CPC ........... H03H 9/02818; H03H 9/02559; H03H 9/02637; H03H 9/02866; H03H 9/14541; H03H 9/25; H03H 9/6483; H03H 9/6489; H03H 9/725; H01L 41/0477

USPC ...................................................... 310/313 A
See application file for complete search history.

(56) References Cited

U.S. PATENT DOCUMENTS

| | | | |
|---|---|---|---|
| 2007/0013459 A1 | 1/2007 | Mimura et al. | ................ 333/133 |
| 2009/0115287 A1 | 5/2009 | Kando | .......................... 310/313 |
| 2016/0211829 A1 | 7/2016 | Iwaki et al. | |

(Continued)

FOREIGN PATENT DOCUMENTS

| | | |
|---|---|---|
| JP | 2016-136712 A | 7/2016 |
| JP | 2016-171571 A | 9/2016 |

(Continued)

*Primary Examiner* — Hafizur Rahman
(74) *Attorney, Agent, or Firm* — Stein IP, LLC

(57) ABSTRACT

An acoustic wave device includes: a Y-cut X-propagation lithium tantalate substrate having a cut angle of 5° or greater and 18° or less; and a grating electrode that is formed of one or more metal films stacked on the lithium tantalate substrate, a number of the one or more metal films being n (n is a natural number), excites an acoustic wave, and meets a condition:

$$0.16\lambda \le \sum_{i=1}^{n}\left(hi\times\sqrt{\frac{\rho i}{\rho 0}}\right) \le 0.24\lambda$$

where ρi represents a density of each metal film of the one or more metal films, hi represents a film thickness of the each metal film, ρ0 represents a density of Mo, and λ represents a pitch.

14 Claims, 17 Drawing Sheets

(56) References Cited

U.S. PATENT DOCUMENTS

2016/0268997 A1 9/2016 Komatsu et al.
2018/0159494 A1 6/2018 Goto et al.
2019/0207583 A1* 7/2019 Miura ................ H03H 9/14541

FOREIGN PATENT DOCUMENTS

| JP | 2018-74575 A | 5/2018 |
| WO | WO 2005/088836 A1 | 9/2005 |
| WO | WO 2006/114930 A1 | 11/2006 |

* cited by examiner

ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2018-011861, filed on Jan. 26, 2018, the entire contents of which are incorporated herein by reference.

FIELD

A certain aspect of the present invention relates to an acoustic wave device, a filter, and a multiplexer.

BACKGROUND

In high frequency communication systems typified by mobile phones, high-frequency filters are used to remove unnecessary signals other than signals in the frequency band used for communication. Acoustic wave devices including surface acoustic wave (SAW) resonators are used in the high-frequency filters. The surface acoustic wave resonator is an element in which grating electrodes of an Interdigital Transducer (IDT) are formed on a piezoelectric substrate. It has been known to reduce the loss by making the acoustic velocity of the surface acoustic wave excited by the grating electrodes lower than the acoustic velocity of a bulk wave propagating through the piezoelectric substrate as disclosed in, for example, Japanese Patent Application Publication No. 2016-136712.

SUMMARY OF THE INVENTION

According to a first aspect of the present invention, there is provided an acoustic wave device including: a Y-cut X-propagation lithium tantalate substrate having a cut angle of 5° or greater and 18° or less; and a grating electrode that is formed of one or more metal films stacked on the lithium tantalate substrate, a number of the one or more metal films being n (n is a natural number), excites an acoustic wave, and meets a condition:

$$0.16\lambda \leq \sum_{i=1}^{n} \left( hi \times \sqrt{\frac{\rho i}{\rho 0}} \right) \leq 0.24\lambda$$

where $\rho i$ represents a density of each metal film of the one or more metal films, $hi$ represents a film thickness of the each metal film, $\rho 0$ represents a density of Mo, and $\lambda$ represents a pitch.

According to a second aspect of the present invention, there is provided an acoustic wave device including: a Y-cut X-propagation lithium tantalate substrate having a cut angle of 5° or greater and 18° or less, and a grating electrode that is located on the lithium tantalate substrate, and excites an acoustic wave, a primary mode of the acoustic wave being an SH-type oscillation mode, an acoustic velocity of the acoustic wave being lower than an acoustic velocity of Rayleigh mode spurious.

According to a third aspect of the present invention, there is provided a filter including the above acoustic wave device.

According to a fourth aspect of the present invention, there is provided a multiplexer including the above filter.

DETAILED DESCRIPTION

The size of the surface acoustic wave resonator is reduced by reducing the pitch $\lambda$ of the grating electrodes. The pitch $\lambda$ decreases as the acoustic velocity of the acoustic wave is decreased. When used as a surface acoustic wave, a Rayleigh wave is slower than a Shear Horizontal (SH) wave. However, when the Rayleigh wave is used as a primary mode, the piezoelectric substrate is covered with a dielectric film to reduce the SH wave that is an unnecessary wave. Thus, the number of fabrication steps increases. When the SH wave is used as a primary mode, the Rayleigh wave generates an unnecessary response (spurious).

Hereinafter, with reference to the accompanying drawings, embodiments of the present invention will be described.

First Embodiment

Figure 1A:
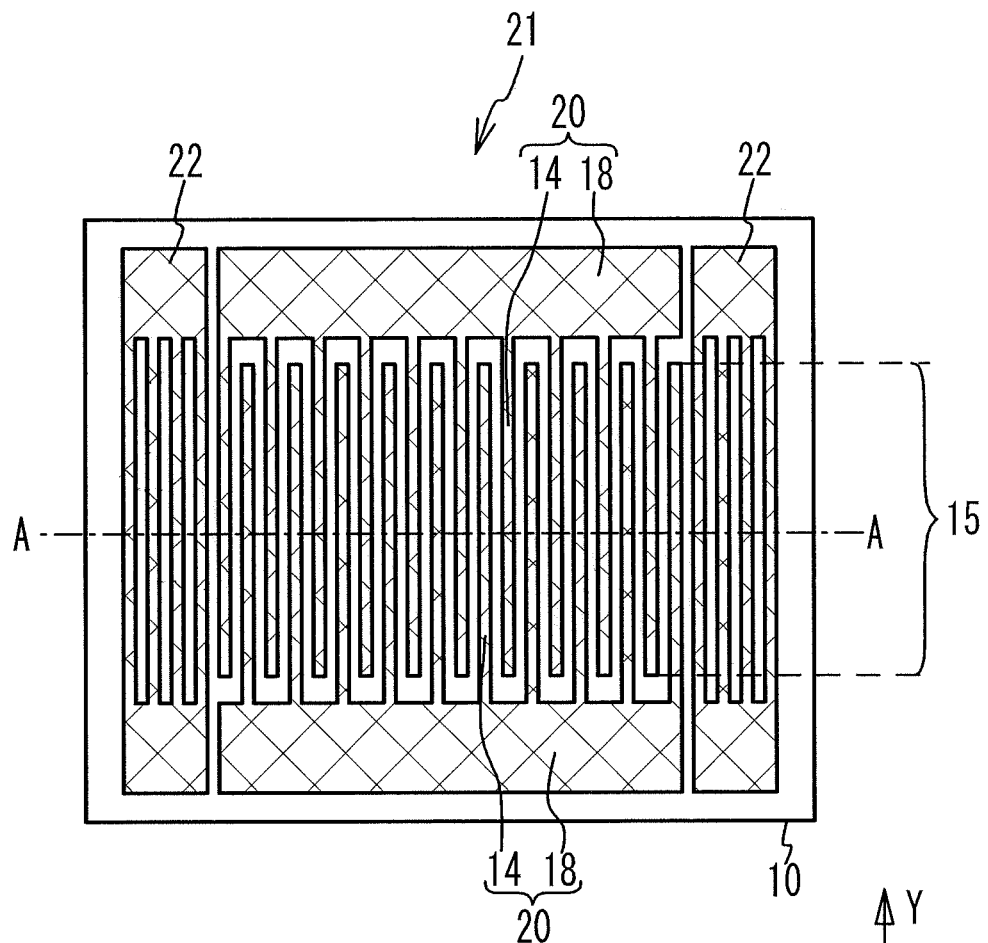
FIG. 1A is a plan view of an acoustic wave resonator in a first embodiment.
Figure 1B:
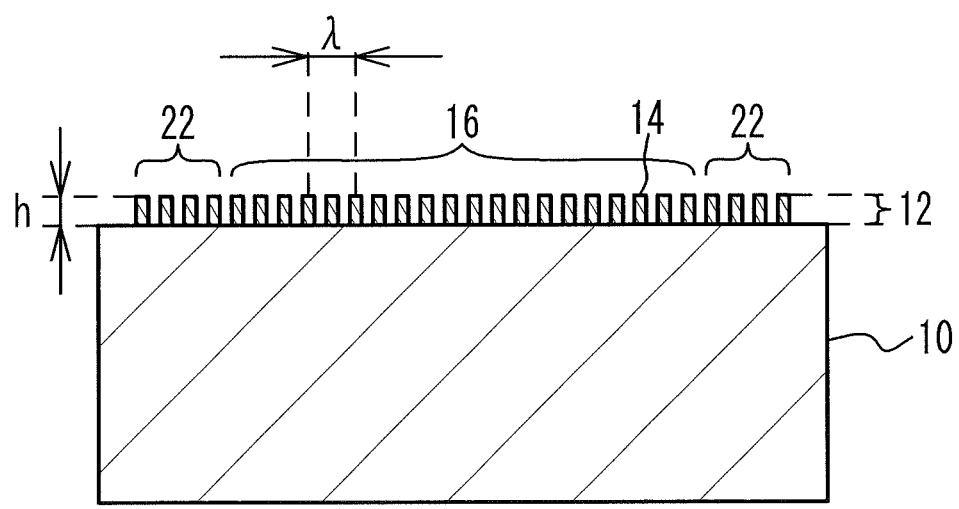
FIG. 1B is a cross-sectional view taken along line A-A in FIG. 1A.

An acoustic wave resonator will be described as the acoustic wave device. FIG. 1A is a plan view of an acoustic wave resonator in a first embodiment, and FIG. 1B is a cross-sectional view taken along line A-A in FIG. 1A. As illustrated in FIG. 1A and FIG. 1B, an IDT 21 and reflectors 22 are formed on a piezoelectric substrate 10. The IDT 21 and the reflectors 22 are formed of a metal film 12 with a film thickness h formed on the piezoelectric substrate 10. The IDT 21 includes a pair of comb-shaped electrodes 20 facing each other. The comb-shaped electrode 20 includes electrode fingers 14 and a bus bar 18 to which the electrode fingers 14 are coupled. The electrode fingers 14 form grating electrodes 16.

The region where the grating electrodes 16 of one of the pair of comb-shaped electrodes 20 overlap with the grating electrodes 16 of the other is an overlap region 15. The length of the overlap region 15 corresponds to an aperture length. The pair of comb-shaped electrodes 20 is arranged so as to face each other so that the electrode fingers 14 of one of the comb-shaped electrodes 20 and the electrode fingers 14 of the other are substantially alternately arranged in at least a part of the overlap region 15. The acoustic wave excited by the grating electrodes 16 in the overlap region 15 propagates mainly in the arrangement direction of the electrode fingers 14. The pitch $\lambda$ of the grating electrodes 16 of one comb-shaped electrode 20 substantially corresponds to the wavelength of the acoustic wave. The arrangement direction of the grating electrodes 16 is defined as an X direction, and the extension direction of the grating electrode 16 is defined as a Y direction. The X direction and the Y direction do not necessarily correspond to the X-axis orientation and the Y-axis orientation of the crystal orientation of the piezoelectric substrate 10. The piezoelectric substrate 10 is a rotated Y-cut X-propagation lithium tantalate ($LiTaO_3$) substrate.

Figure 2:
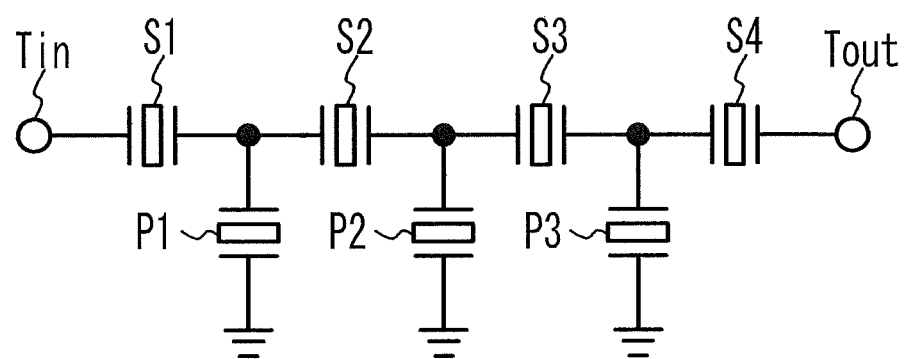
FIG. 2 is a circuit diagram of a ladder-type filter including the acoustic wave resonator in accordance with the first embodiment.

FIG. 2 is a circuit diagram of a ladder-type filter including the acoustic wave resonator in accordance with the first embodiment. As illustrated in FIG. 2, series resonators S1 through S4 are connected in series and parallel resonators P1 through P3 are connected in parallel between an input terminal Tin and an output terminal Tout. The series resonators S1 through S4 and the parallel resonators P1 through P3 are the acoustic wave resonators illustrated in FIG. 1A and FIG. 1B. The ladder-type filter transmits signals in the passband to the output terminal Tout among high-frequency signals input from the input terminal Tin, and suppresses signals with other frequencies.

Figure 3A:
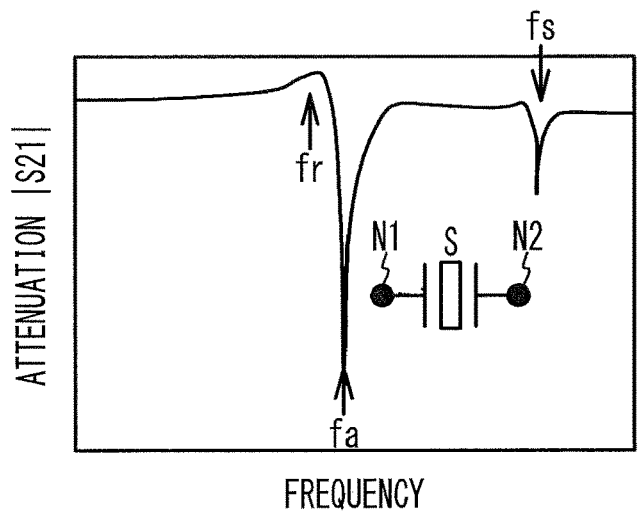
FIG. 3A through FIG. 3C illustrate the transmission characteristics of a series resonator, a parallel resonator, and a filter, respectively.
Figure 3B:
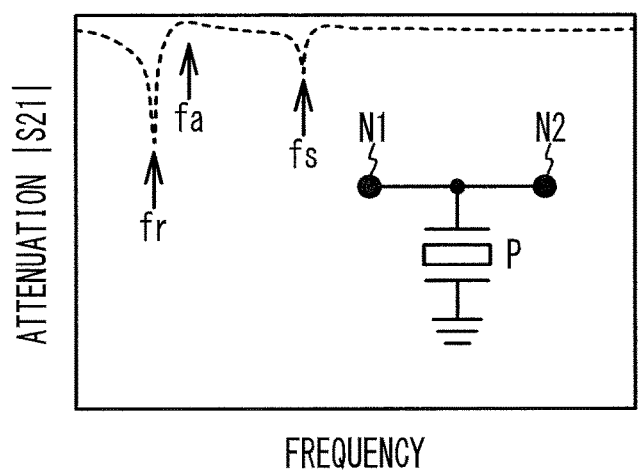
Figure 3C:
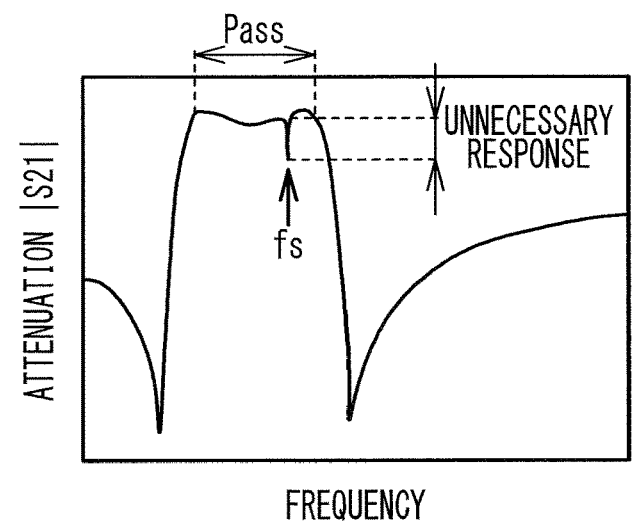

FIG. 3A through FIG. 3C illustrate the transmission characteristics of a series resonator, a parallel resonator, and a filter, respectively. As illustrated in FIG. 3A, in the transmission characteristic between nodes N1 and N2 of a series resonator S connected in series between the nodes N1 and N2, the attenuation is small at a resonant frequency fr, and the attenuation is large at an antiresonant frequency fa. An unnecessary response is generated at a frequency fs higher than the antiresonant frequency fa.

As illustrated in FIG. 3B, in the transmission characteristic between the nodes N1 and N2 of a parallel resonator P connected in parallel between the nodes N1 and N2, the attenuation is large at the resonant frequency fr, and the attenuation is small at the antiresonant frequency fa. An unnecessary response is generated at the frequency fs higher than the antiresonant frequency fa. As illustrated in FIG. 3C, in the ladder-type filter, the unnecessary response of the parallel resonator P is mainly generated at the frequency fs within a passband Pass.

The size of the acoustic wave resonator is reduced by reducing the pitch $\lambda$ of the grating electrodes 16. The use of the Rayleigh wave having a low acoustic velocity as a primary mode reduces the size of the acoustic wave resonator. However, when the Rayleigh wave is used as a primary mode, the SH wave having a higher acoustic velocity (i.e., higher frequency) than the Rayleigh wave generates an unnecessary response. To reduce the unnecessary response intensity of the SH wave in the acoustic wave resonator using the Rayleigh wave as a primary mode, the piezoelectric substrate 10 is covered with a dielectric film, and the surface of the dielectric film is planarized. Accordingly, the number of fabrication steps increases.

Simulation 1

A simulation was conducted with use of the finite element method to obtain the ranges of the rotated Y-cut angle and the film thickness within which the acoustic velocity of the SH wave is lower than the acoustic velocity of the Rayleigh wave and the intensity of the unnecessary response of the Rayleigh wave is small. The simulation conditions are as follows.

Piezoelectric substrate 10: Rotated Y-cut X-propagation lithium tantalate substrate
Pitch $\lambda$: 4 μm
Duty ratio of electrode fingers: 50%
Number of pairs of electrode fingers in the IDT: 55.5 pairs
Number of electrodes in the reflector: 20
Aperture length: 35$\lambda$
Metal film 12: Molybdenum (Mo) with a film thickness of h For the material values of Mo, the density was assumed to be $1.028 \times 10^4$ kg/$m^3$, the Young's modulus was assumed to be 329 GPa, and the Poisson ratio was assumed to be 0.31.

The rotated Y-cut angle was varied from 0° to 30°, and the film thickness h was varied from 0.14$\lambda$ to 0.26$\lambda$ to simulate the magnitude of the admittance |Y| with respect to the normalized frequency.

FIG. 4A through FIG. 10B are graphs of |Y| versus the normalized frequency in the simulation 1 when the rotated Y-cut angle is 0°, 3°, 5°, 8°, 10°, 11°, 13°, 14°, 15°, 16°, 18°, 20°, 25°, and 30°, respectively. FIG. 4A through FIG. 10B illustrate |Y| when the film thickness h/$\lambda$ is 0.14, 0.16, 0.18, 0.20, 0.22, 0.24, and 0.26. White triangles indicate the SH wave response, and open circles indicate the Rayleigh wave response.

As illustrated in FIG. 4A through FIG. 10B, the frequency of the SH wave response is lower than the frequency of the Rayleigh wave response. Thus, when the rotated Y-cut angle is within the range of 0° to 30°, the acoustic velocity of the SH wave is lower than the acoustic velocity of the Rayleigh wave.

Figure 4A:
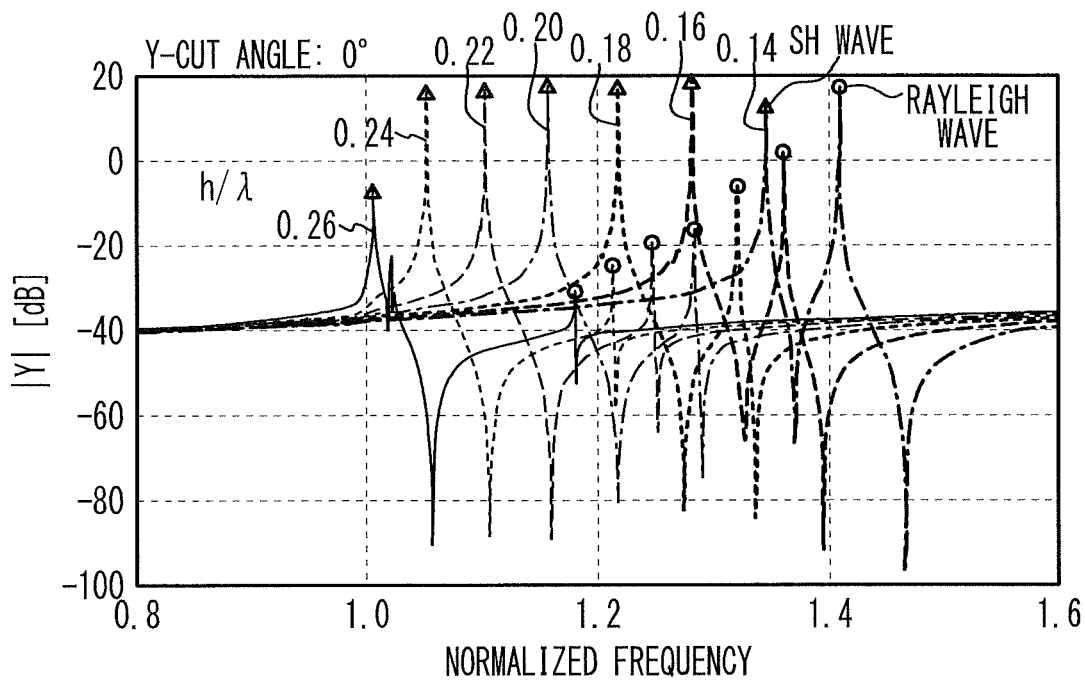
FIG. 4A and FIG. 4B are graphs of |Y| versus normalized frequency when a rotated Y-cut angle is 0° and 3° in a simulation 1, respectively.
Figure 4B:
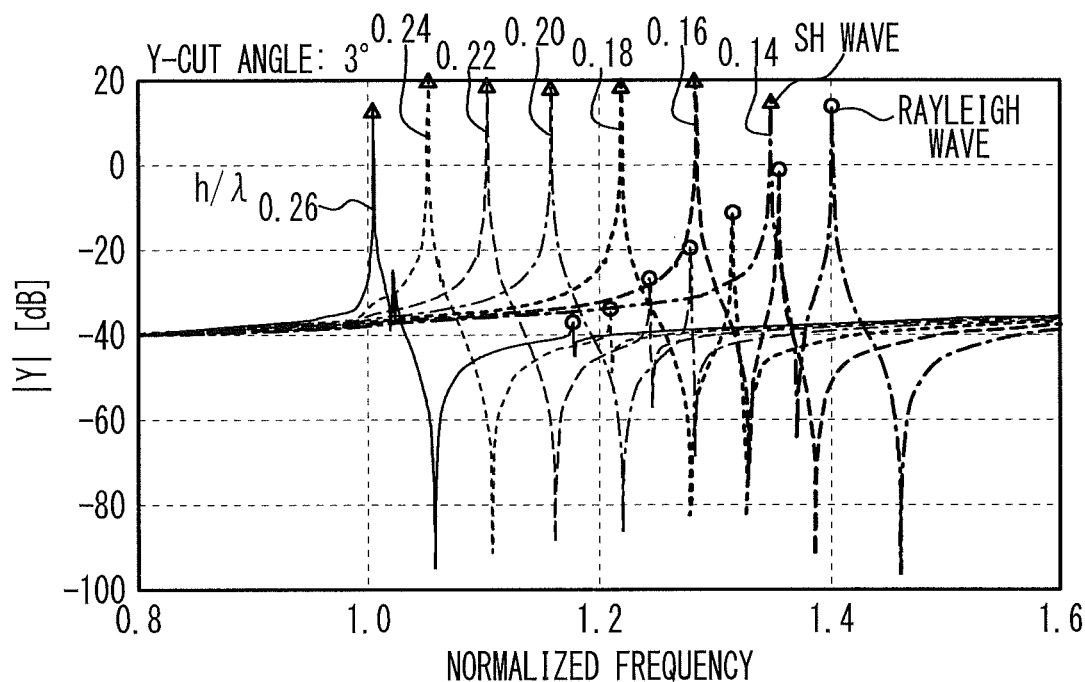
Figure 5A:
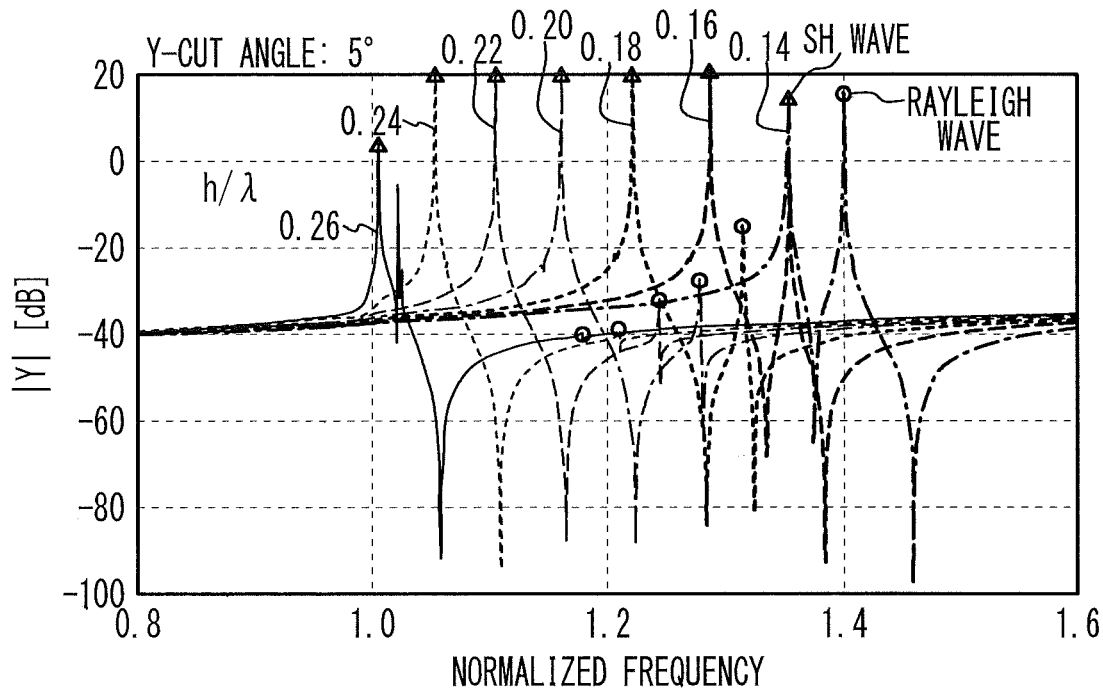
FIG. 5A and FIG. 5B are graphs of |Y| versus normalized frequency when the rotated Y-cut angle is 5° and 8° in the simulation 1, respectively.
Figure 5B:
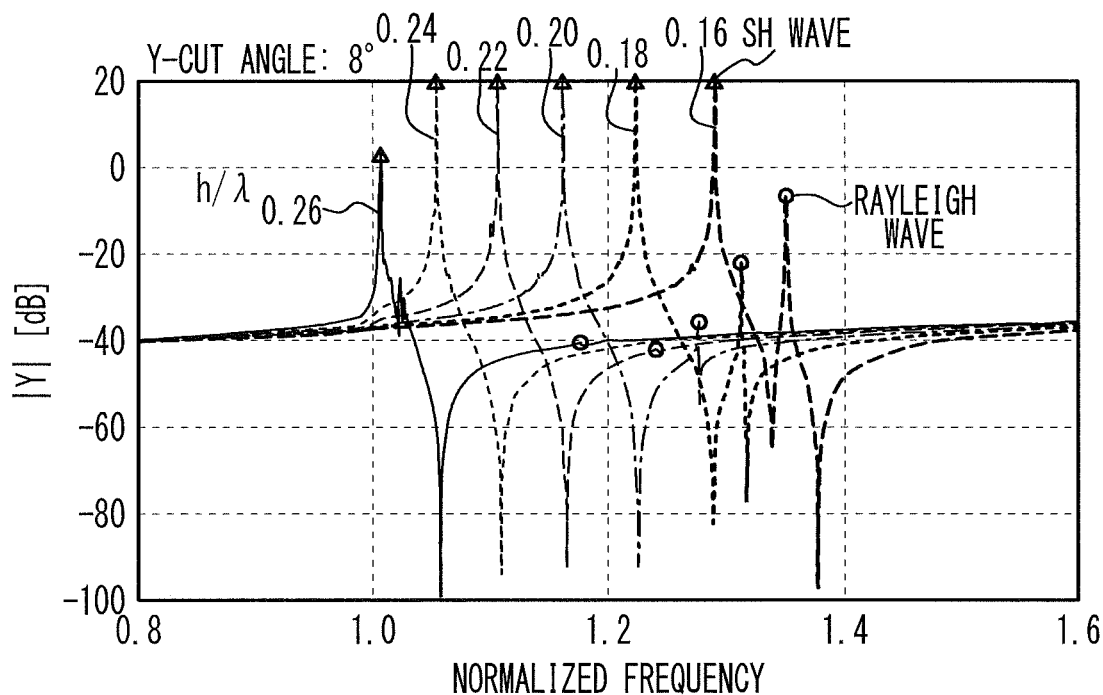

As illustrated in FIG. 4A, in the case where the rotated Y-cut angle is 0°, the Rayleigh wave response and the SH wave response have substantially the same magnitude when the film thickness h/$\lambda$ is 0.14. As the film thickness h/$\lambda$ increases, the Rayleigh wave response intensity decreases, but is not sufficiently small. As illustrated in FIG. 4B, when the rotated Y-cut angle is 3°, the Rayleigh wave response is small. As illustrated in FIG. 5A, in the case where the rotated Y-cut angle is 5°, the Rayleigh wave response is the smallest and very small when the film thickness h/$\lambda$ is 0.26. As illustrated in FIG. 5B, in the case where the rotated Y-cut angle is 8°, the Rayleigh wave response is the smallest and is hardly observed when the film thickness h/$\lambda$ is 0.24.

Figure 6A:
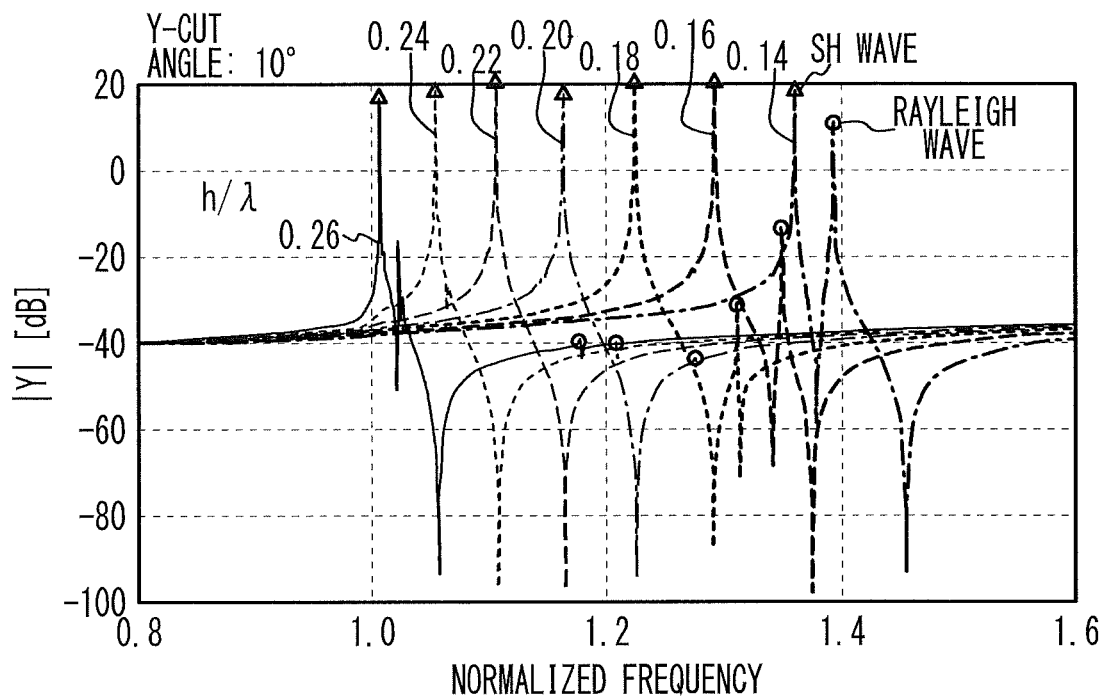
FIG. 6A and FIG. 6B are graphs of |Y| versus normalized frequency when the rotated Y-cut angle is 10° and 11° in the simulation 1, respectively.
Figure 6B:
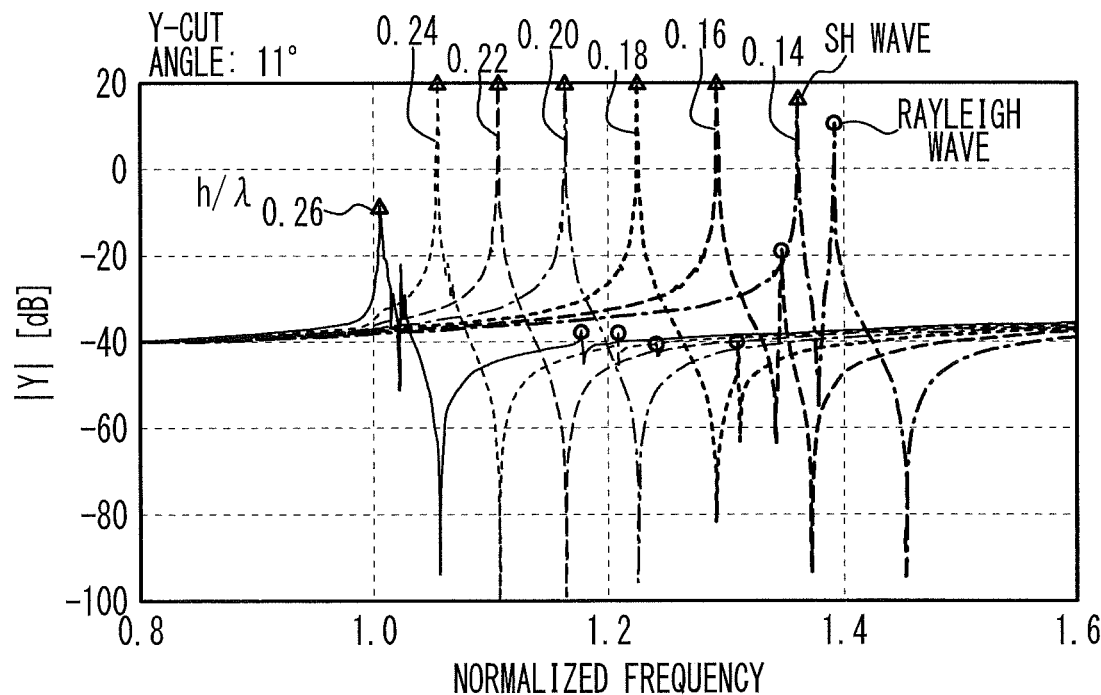
Figure 7A:
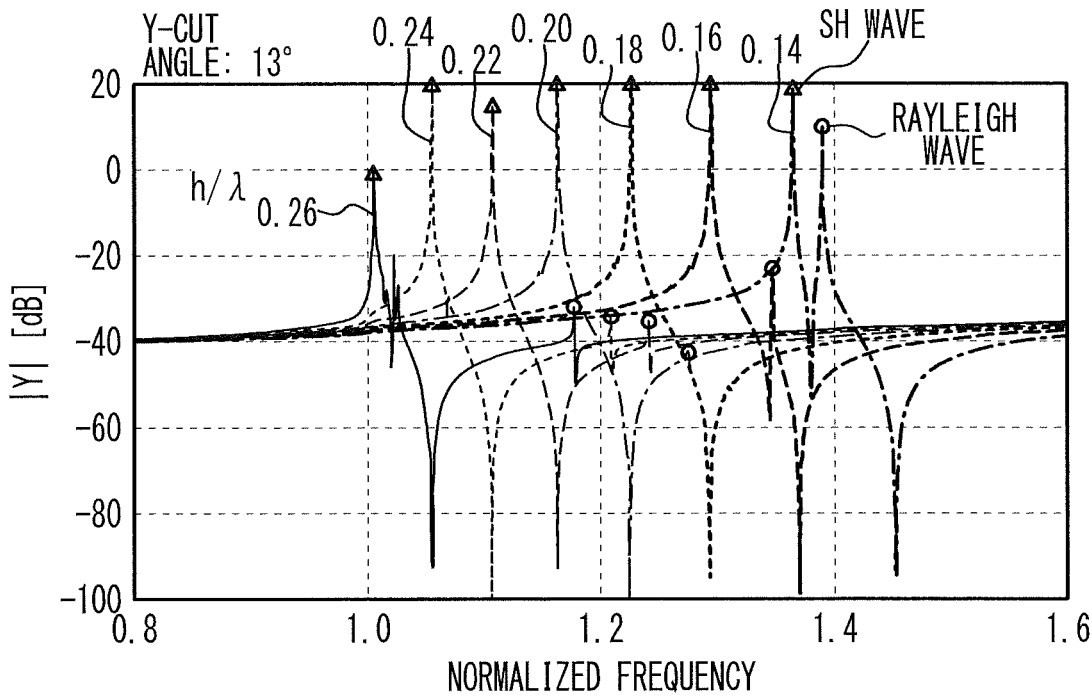
FIG. 7A and FIG. 7B are graphs of |Y| versus normalized frequency when the rotated Y-cut angle is 13° and 14° in the simulation 1, respectively.
Figure 7B:
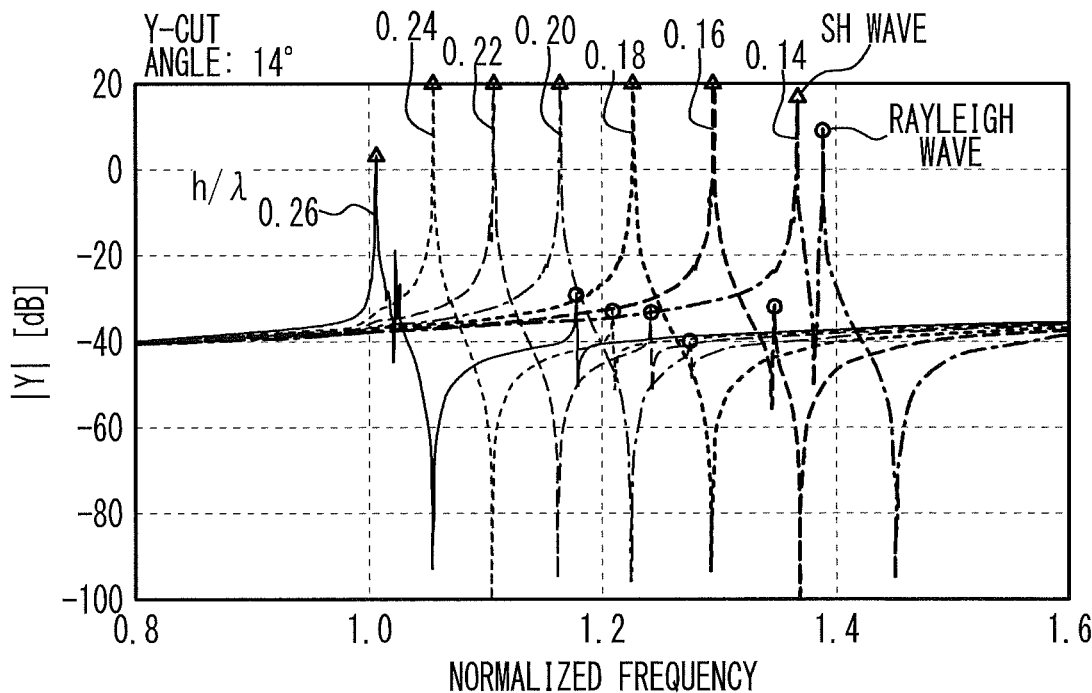

As illustrated in FIG. 6A, in the case where the rotated Y-cut angle is 10°, the Rayleigh wave response is the smallest and cannot be observed when the film thickness h/$\lambda$ is 0.22. As illustrated in FIG. 6B, in the case where the rotated Y-cut angle is 11°, the Rayleigh wave response is the smallest and cannot be observed when the film thickness h/$\lambda$ is 0.20. As illustrated in FIG. 7A, in the case where the rotated Y-cut angle is 13°, the Rayleigh wave response is the smallest and cannot be observed when the film thickness h/λ is 0.18. As illustrated in FIG. 7B, in the case where the rotated Y-cut angle is 14°, the Rayleigh wave response is the smallest and cannot be observed when the film thickness h/λ is 0.18.

Figure 8A:
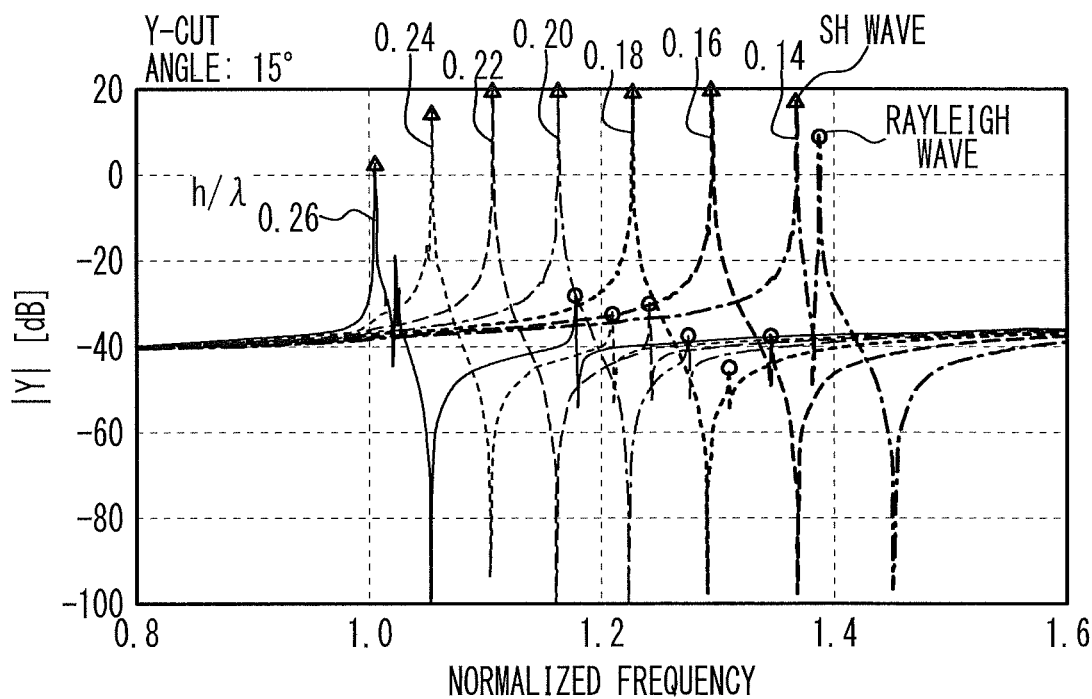
FIG. 8A and FIG. 8B are graphs of |Y| versus normalized frequency when the rotated Y-cut angle is 15° and 16° in the simulation 1, respectively.
Figure 8B:
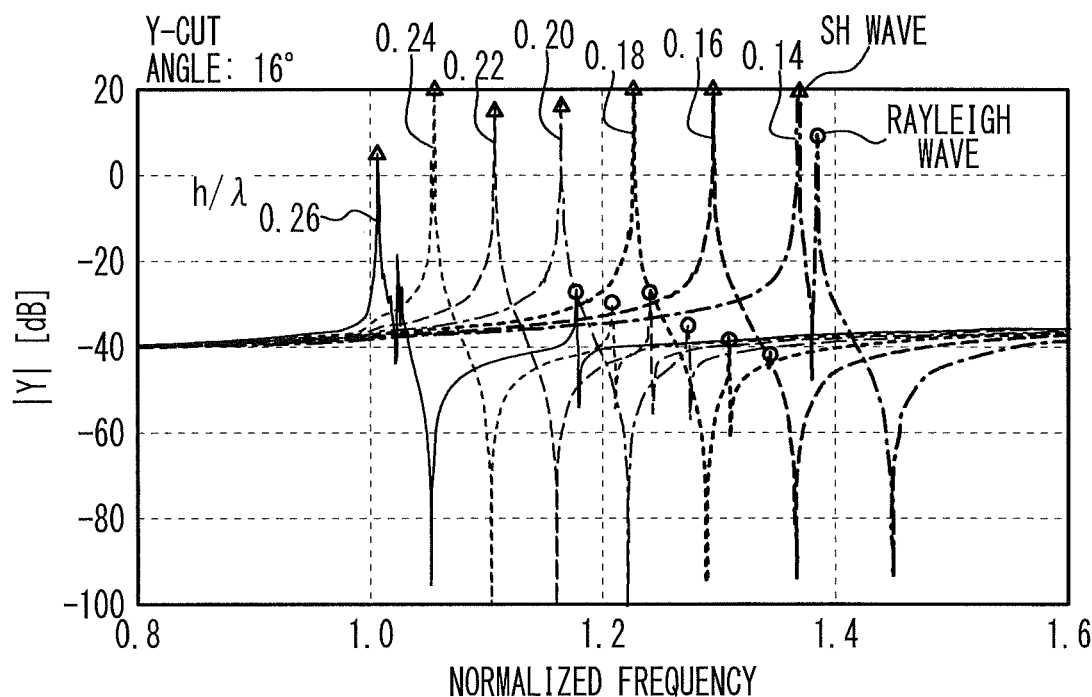
Figure 9A:
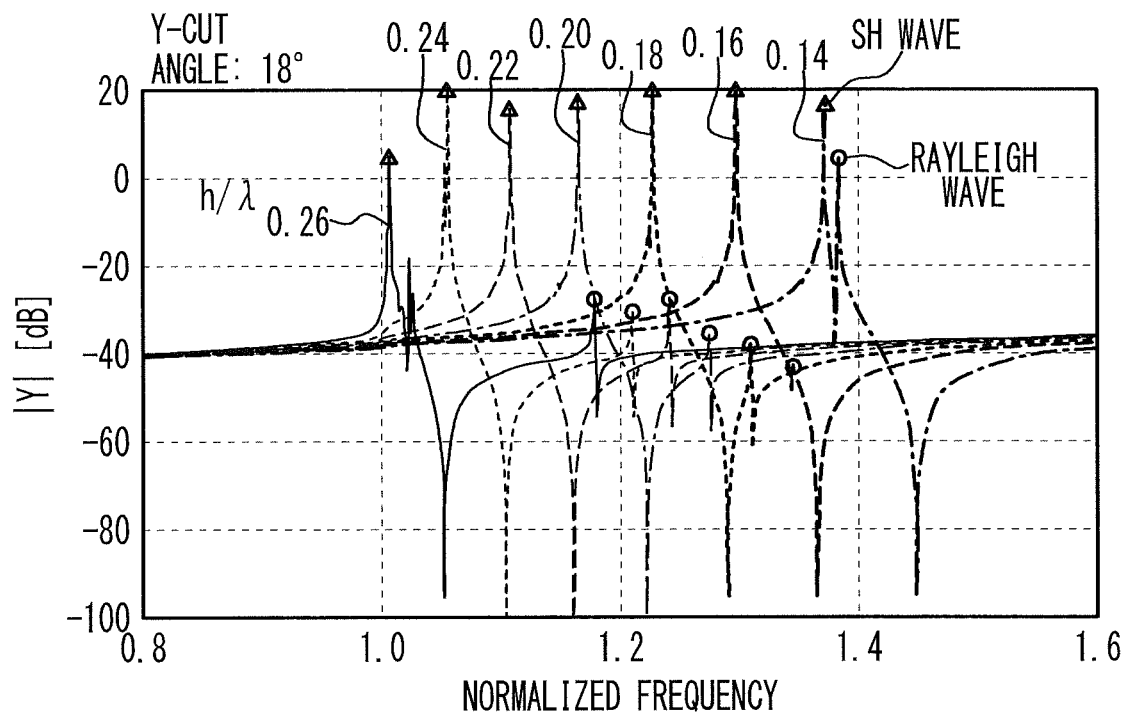
FIG. 9A and FIG. 9B are graphs of |Y| versus normalized frequency when the rotated Y-cut angle is 18° and 20° in the simulation 1, respectively.
Figure 9B:
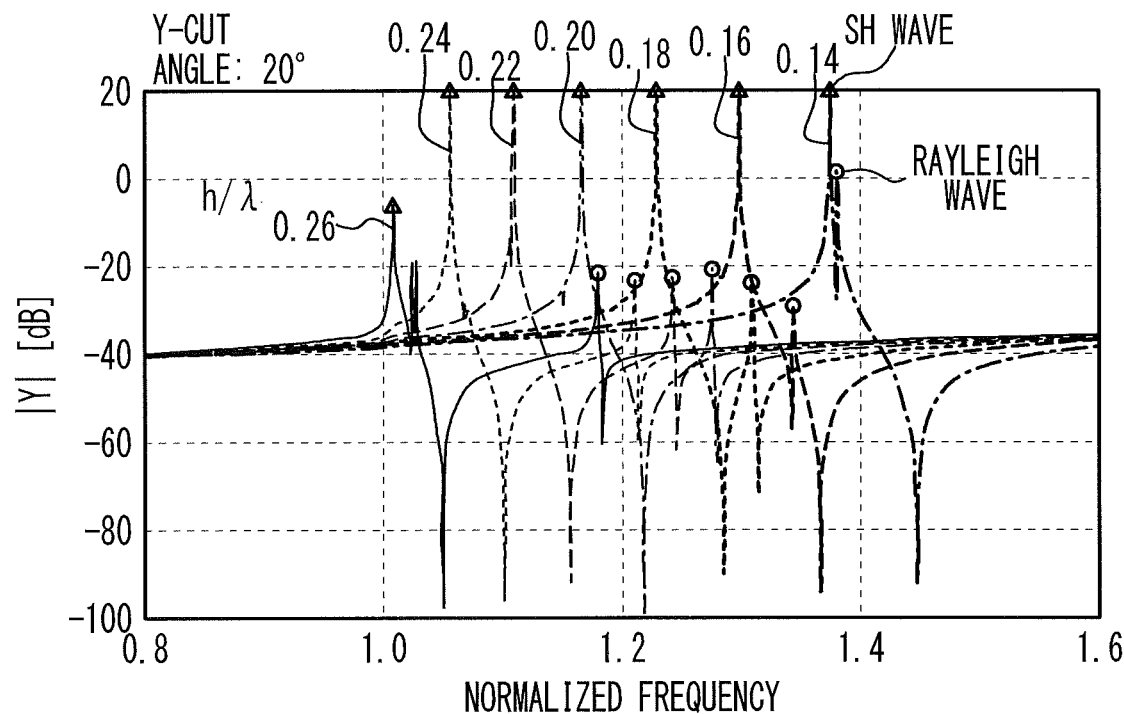
Figure 10A:
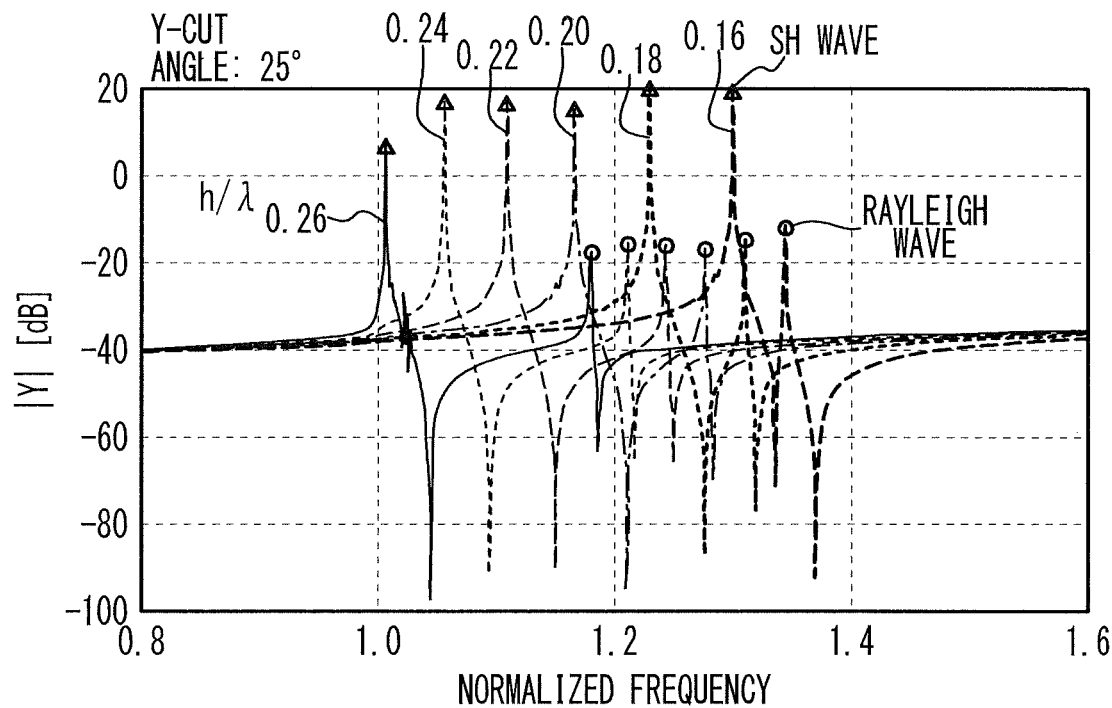
FIG. 10A and FIG. 10B are graphs of |Y| versus normalized frequency when the rotated Y-cut angle is 25° and 30° in the simulation 1, respectively.
Figure 10B:
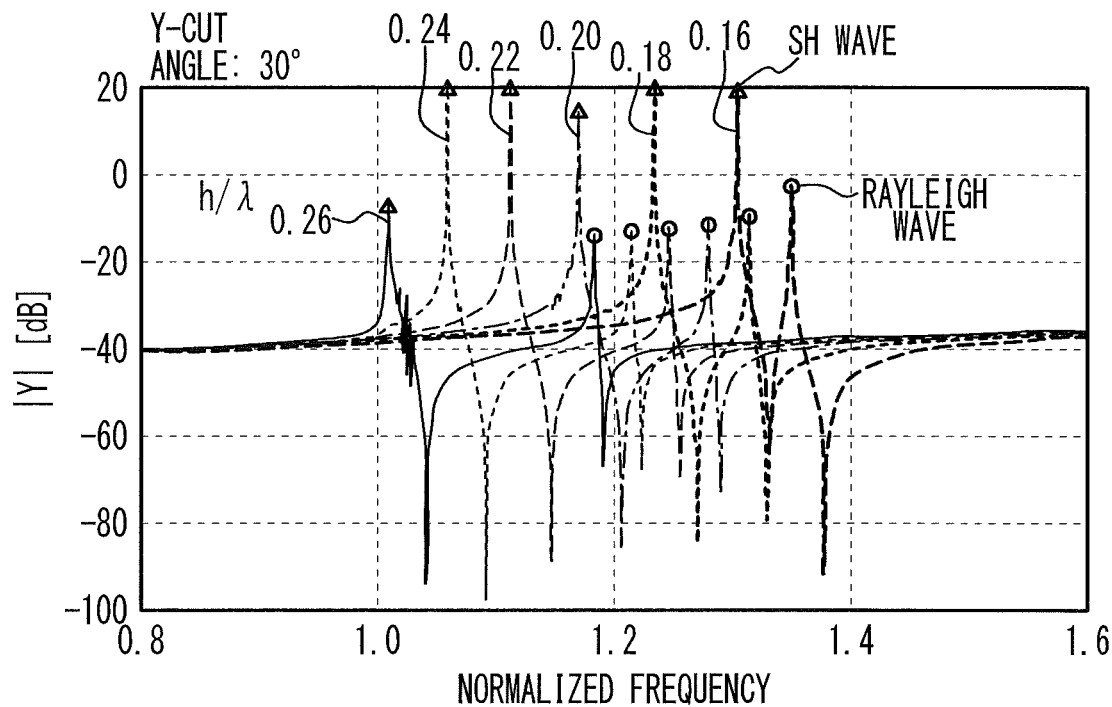

As illustrated in FIG. 8A, in the case where the rotated Y-cut angle is 15°, the Rayleigh wave response is the smallest when the film thickness h/λ is 0.18. As illustrated in FIG. 8B, in the case where the rotated Y-cut angle is 16°, the Rayleigh wave response is the smallest when the film thickness h/λ is 0.16. As illustrated in FIG. 9A, in the case where the rotated Y-cut angle is 18°, the Rayleigh wave response is the smallest when the film thickness h/λ is 0.16. As illustrated in FIG. 9B, in the case when the rotated Y-cut angle is 20°, the Rayleigh wave response is large for any film thickness h/λ. As illustrated in FIG. 10A and FIG. 10B, in the case where the rotated Y-cut angle is 25° and 30°, the Rayleigh wave response is large for any film thickness h/λ.

Simulation 2

Simulated was the intensity of the Rayleigh wave unnecessary response generated in the passband Pass of the ladder-type filter as illustrated in FIG. 3C when the acoustic wave resonator simulated in the simulation 1 was used as the series resonators S1 through S4 and the parallel resonators P1 through P3 of the ladder-type filter illustrated in FIG. 2.

Figure 11:
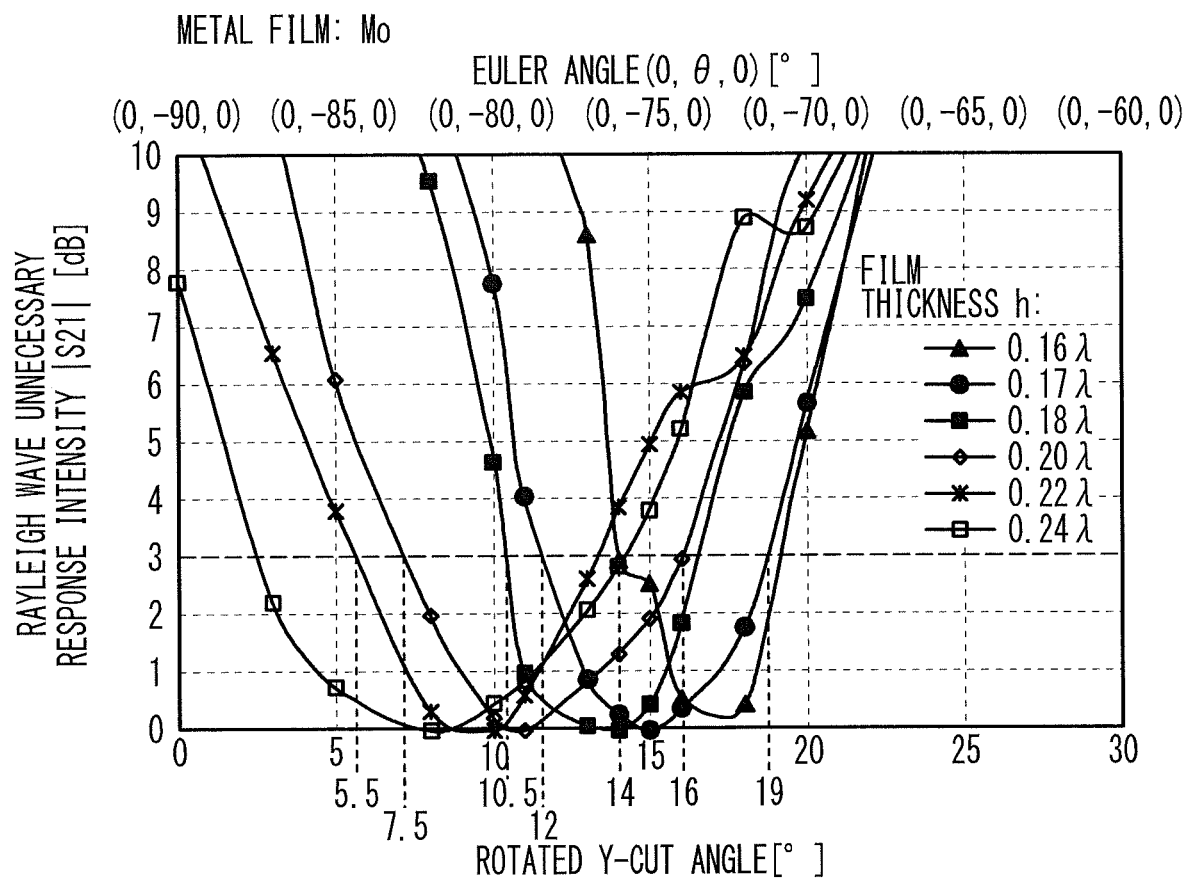
FIG. 11 is a graph of Rayleigh wave unnecessary response intensity versus the rotated Y-cut angle in a simulation 2.
Figure 12:
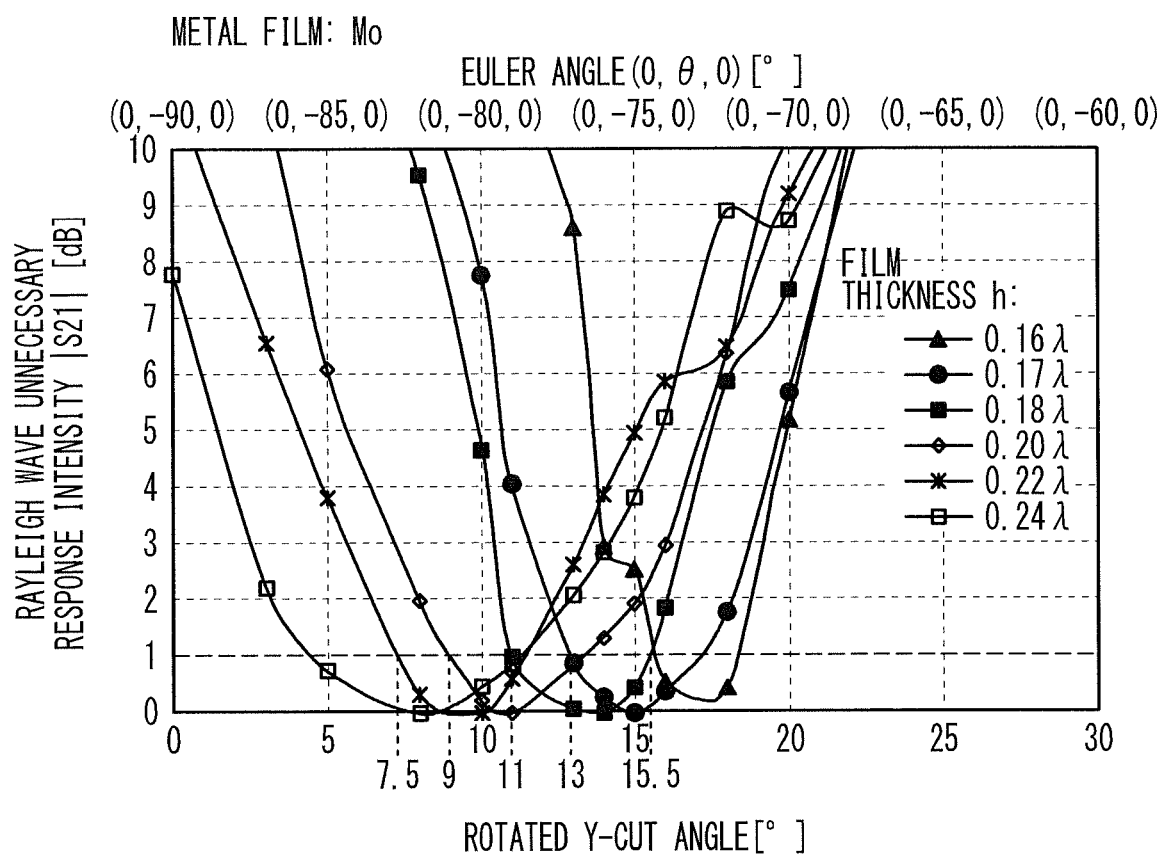
FIG. 12 is a graph of Rayleigh wave unnecessary response intensity versus the rotated Y-cut angle in the simulation 2.
Figure 13:
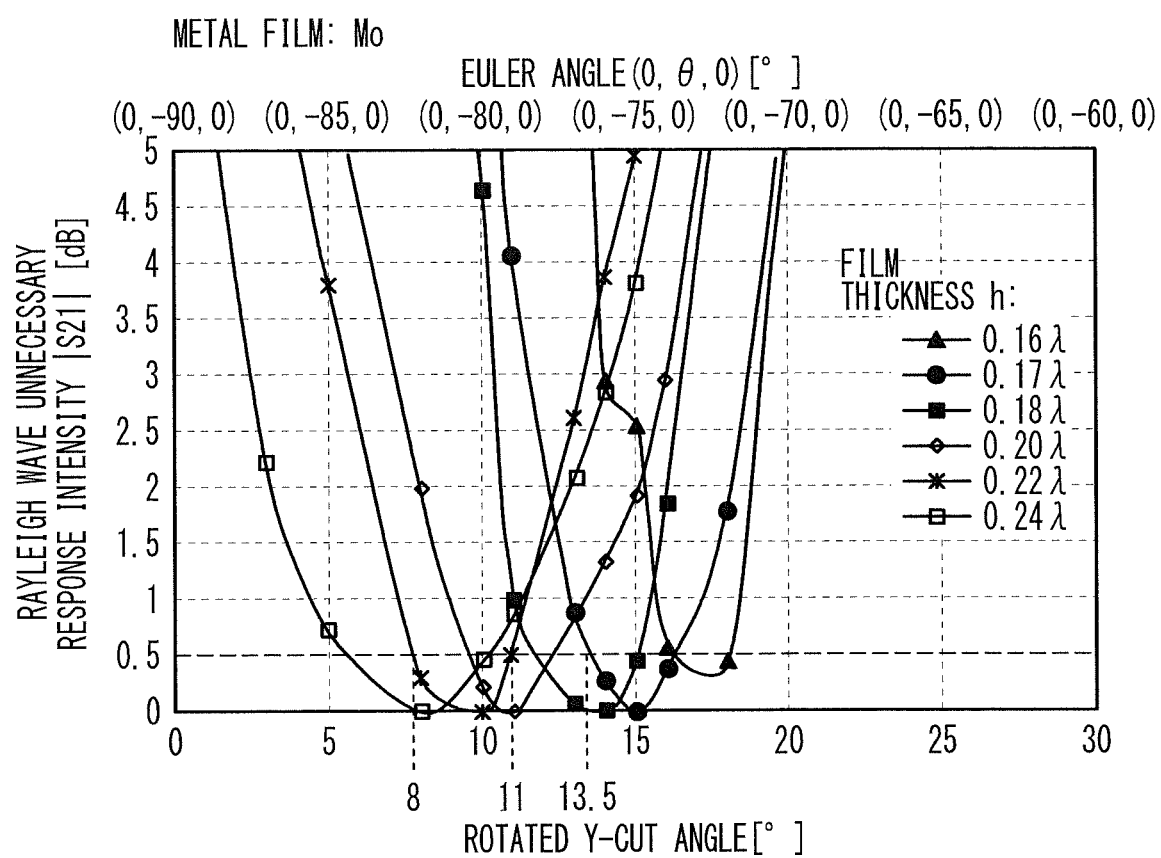
FIG. 13 is a graph of Rayleigh wave unnecessary response intensity versus the rotated Y-cut angle in the simulation 2.

FIG. 11 through FIG. 13 are graphs of Rayleigh wave unnecessary response intensity versus the rotated Y-cut angle in a simulation 2. The rotated Y-cut angle can also be expressed by Euler angle (0, θ, 0) [°]. Rotated Y-cut angles of 0°, 5°, 10°, 15°, 20°, 25°, and 30° respectively correspond to Euler angles of (0, −90, 0), (0, −85, 0), (0, −80, 0), (0, −75, 0), (0, −70, 0), (0, −65, 0), and (0, −60, 0).

As illustrated in FIG. 11 through FIG. 13, as the film thickness h/λ decreases, the rotated Y-cut angle at which the Rayleigh wave unnecessary response intensity is minimum increases.

The unnecessary response intensity of the Rayleigh wave becomes 3 dB or less when the rotated Y-cut angle and the film thickness h/λ are within the following respective ranges. As illustrated in FIG. 11, the Rayleigh wave unnecessary response intensity is 3 dB or less when the rotated Y-cut angle is within the range of 5.5° or greater and 7.5° or less and the film thickness h/λ is within the range of 0.22 or greater and 0.24 or less. The Rayleigh wave unnecessary response intensity is 3 dB or less when the rotated Y-cut angle is within the range of 7.5° or greater and 10.5° or less and the film thickness h/λ is within the range of 0.20 or greater and 0.24 or less. The Rayleigh wave unnecessary response intensity is 3 dB or less when the rotated Y-cut angle is within the range of 10.5° or greater and 12° or less and the film thickness h/λ is within the range of 0.18 or greater and 0.24 or less.

The Rayleigh wave unnecessary response intensity is 3 dB or less when the rotated Y-cut angle is within the range of 12° or greater and 14° or less and the film thickness h/λ is within the range of 0.17 or greater and 0.24 or less. The Rayleigh wave unnecessary response intensity is 3 dB or less when the rotated Y-cut angle is within the range of 14° or greater and 16° or less and the film thickness h/λ is within the range of 0.16 or greater and 0.20 or less. The Rayleigh wave unnecessary response intensity is 3 dB or less when the rotated Y-cut angle is within the range of 16° or greater and 19° or less and the film thickness h/λ is within the range of 0.16 or greater and 0.17 or less.

The unnecessary response intensity of the Rayleigh wave becomes 1 dB or less when the rotated Y-cut angle and the film thickness h/λ are within the following respective ranges. As illustrated in FIG. 12, the Rayleigh wave unnecessary response intensity is 1 dB or less when the rotated Y-cut angle is within the range of 7.5° or greater and 9° or less and the film thickness h/λ is within the range of 0.22 or greater and 0.24 or less. The Rayleigh wave unnecessary response intensity is 1 dB or less when the rotated Y-cut angle is within the range of 9° or greater and 11° or less and the film thickness h/λ is within the range of 0.20 or greater and 0.24 or less. The Rayleigh wave unnecessary response intensity is 1 dB or less when the rotated Y-cut angle is within the range of 11° or greater and 13° or less and the film thickness h/λ is within the range of 0.18 or greater and 0.20 or less. The Rayleigh wave unnecessary response intensity is 1 dB or less when the rotated Y-cut angle is within the range of 13° or greater and 15.5° or less and the film thickness h/λ is within the range of 0.17 or greater and 0.18 or less.

The unnecessary response intensity of the Rayleigh wave becomes 0.5 dB or less when the rotated Y-cut angle and the film thickness h/λ are within the following respective ranges. As illustrated in FIG. 13, the Rayleigh wave unnecessary response intensity is 0.5 dB or less when the rotated Y-cut angle is within the range of 8° or greater and 10° or less and the film thickness h/λ is within the range of 0.22 or greater and 0.24 or less. The Rayleigh wave unnecessary response intensity is 0.5 dB or less when the rotated Y-cut angle is within the range of 10° or greater and 11° or less and the film thickness h/λ is within the range of 0.20 or greater and 0.22 or less. The Rayleigh wave unnecessary response intensity is 0.5 dB or less when the rotated Y-cut angle is within the range of 13.5° or greater and 15° or less and the film thickness h/λ is within the range of 0.17 or greater and 0.18 or less.

In the specifications for the ladder-type filter, the Rayleigh wave unnecessary response intensity is often specified to be 1 dB or less. As illustrated in FIG. 12, when the rotated Y-cut angle is 5° or greater and 18° or less, the range of the film thickness h/λ in which the Rayleigh wave unnecessary response intensity is 1 dB or less is in the range of 0.16 to 0.24.

Simulation 3

The same simulation as the simulations 1 and 2 was conducted for the case where the metal film 12 is made of ruthenium (Ru) or rhodium (Rh). Table 1 lists the density, the Young's modulus, and the Poisson ratio of each of Mo, Ru, and Rh.

TABLE 1

|  | Mo | Ru | Rh |
|---|---|---|---|
| Density [kg/m$^3$] | $1.028 \times 10^4$ | $1.237 \times 10^4$ | $1.245 \times 10^4$ |
| Young's modulus [GPa] | 329 | 447 | 359 |
| Poisson ratio | 0.31 | 0.30 | 0.26 |

Figure 14:
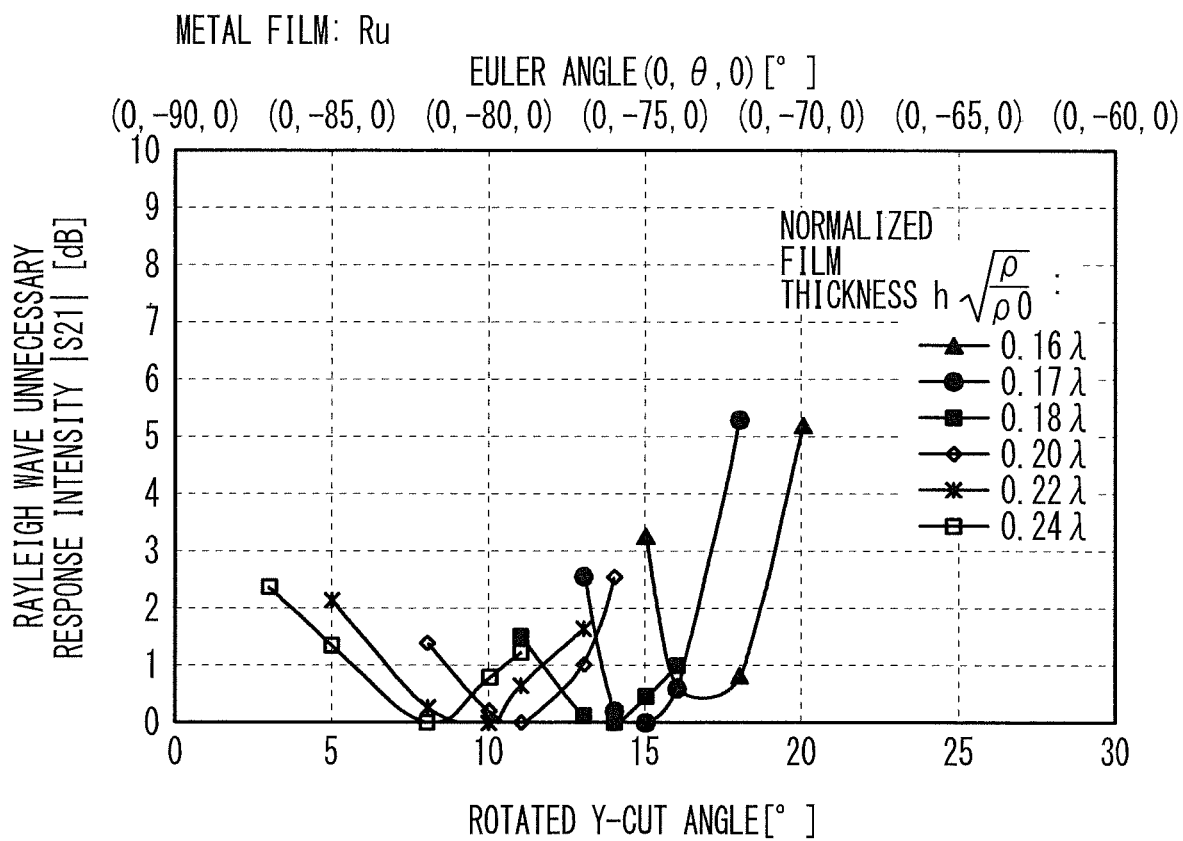
FIG. 14 is a graph of Rayleigh wave unnecessary response intensity versus the rotated Y-cut angle in a simulation 3.
Figure 15:
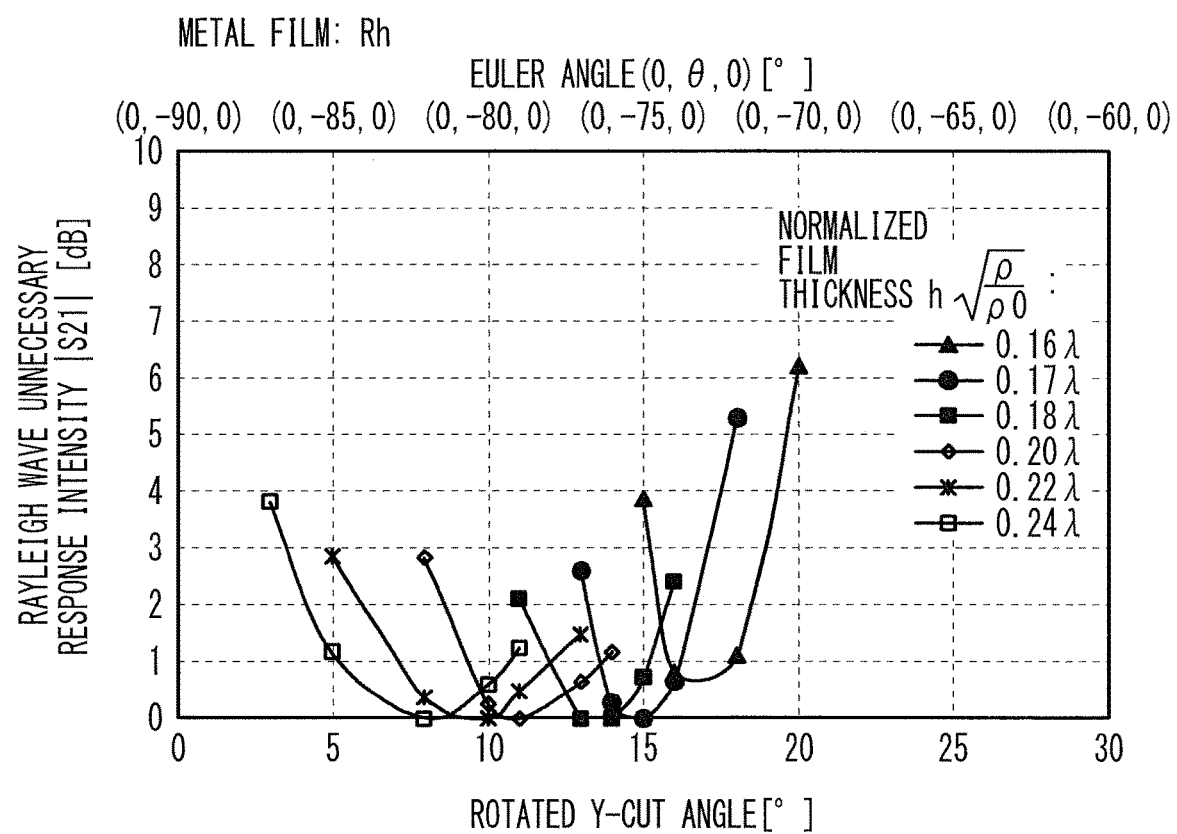
FIG. 15 is a graph of Rayleigh wave unnecessary response intensity versus the rotated Y-cut angle in the simulation 3.

FIG. 14 and FIG. 15 are graphs of Rayleigh wave unnecessary response intensity versus the rotated Y-cut angle in a simulation 3. FIG. 14 illustrates a case where the metal film 12 was assumed to be made of Ru, and FIG. 15 illustrates a case where the metal film 12 was assumed to be made of Rh. The normalized film thickness was defined as $h\sqrt{\rho/\rho 0}$ where $\rho 0$ represents the density of Mo and $\rho$ represents the density of Ru or Rh.

As illustrated in FIG. 14 and FIG. 15, when the normalized film thickness $h\sqrt{\rho/\rho 0}$ is used, the results are almost the same as those in the case where the metal film 12 is made of Mo illustrated in FIG. 11 regardless of the material of the metal film 12. The simulation was conducted by using materials having different densities, different Young's moduli, and different Poisson ratios as presented in Table 1, and the simulation reveals that the Rayleigh wave unnecessary response hardly depends on the Young's modulus and the Poisson ratio but depends on the density. As described above, the use of the normalized film thickness obtained by normalizing the film thickness h of the metal film 12 with use of the density ρ generalizes the results of FIG. 11 to FIG. 13.

Variations of the First Embodiment

Figure 16A:
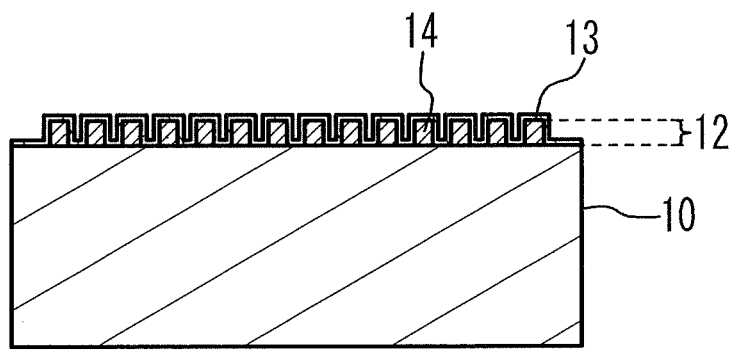
FIG. 16A through FIG. 16C are cross-sectional views of acoustic wave resonators in accordance with first through third variations of the first embodiment, respectively.
Figure 16B:
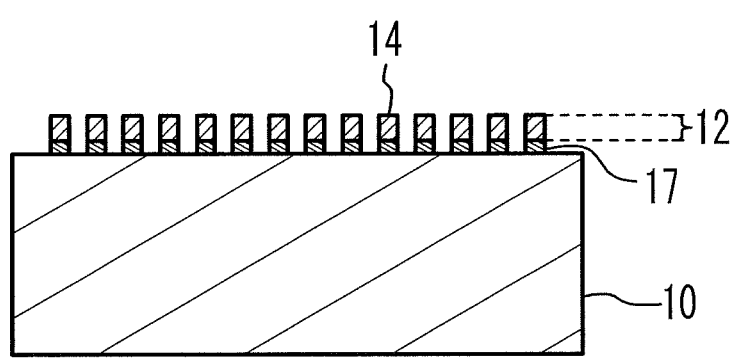
Figure 16C:
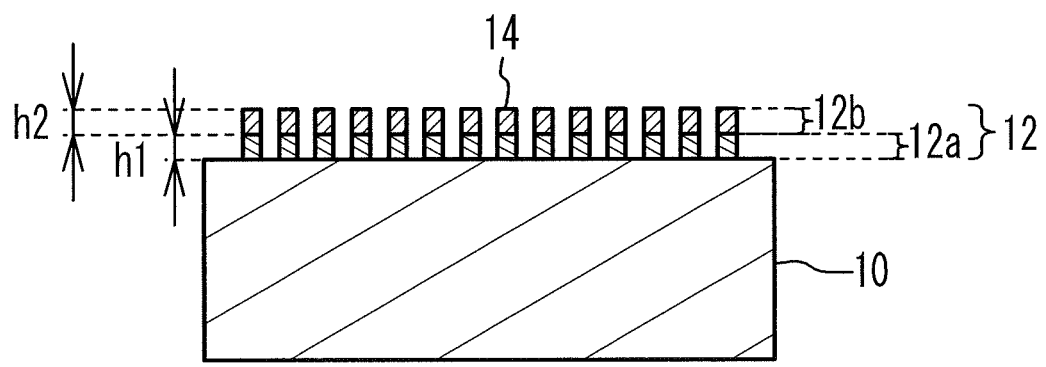

FIG. 16A through FIG. 16C are cross-sectional views of acoustic wave resonators in accordance with first through third variations of the first embodiment, respectively. As illustrated in FIG. 16A, a dielectric film 13 is formed on the piezoelectric substrate 10 so as to cover the metal film 12. The dielectric film 13 is a film for frequency adjustment and/or protection. The dielectric film 13 can be, for example, a silicon oxide film, a silicon nitride film, or an aluminum oxide film. The dielectric film 13 is more lightweight than the metal film 12. Thus, the presence or absence of the dielectric film 13 hardly affects the results of the above simulations.

As illustrated in FIG. 16B, an adhesion layer 17 may be formed between the metal film 12 and the piezoelectric substrate 10. The adhesion layer 17 is a film for improving the adherence between the metal film 12 and the piezoelectric substrate 10. The adhesion layer 17 can be made of, for example, titanium (Ti) or chrome (Cr). The material of the adhesion layer 17 is more lightweight and thinner than the metal film 12. Thus, the presence or absence of the adhesion layer 17 hardly affects the results of the above simulations.

As illustrated in FIG. 16C, the metal film 12 may be formed by stacking metal films 12a and 12b. In this structure, the normalized film thickness is the sum of the normalized film thicknesses of the metal films 12a and 12b. The film thickness and the density of the metal film 12a are respectively represented by h1 and ρ1, and the film thickness and the density of the metal film 12b are respectively represented by h2 and ρ2. The normalized film thickness of the metal film 12a is $h1\sqrt{\rho1/\rho0}$, and the normalized film thickness of the metal film 12b is $h2\sqrt{\rho1/\rho0}$. Thus, the normalized film thickness of the metal film 12 is $h1\sqrt{\rho1/\rho0}+h2\sqrt{\rho1/\rho0}$, More generally, when the grating electrode 16 is formed of one or more metal films 12 (the number of the one or more metal films 12 is n wherein n is a natural number) stacked on the lithium tantalate substrate and the density of each metal film of the one or more metal films represented by ρi, the film thickness of each metal film is represented by hi, the density of Mo is represented by ρ0, and the pitch is represented by λ, the normalized film thickness is calculated by $$\sum_{i=1}^{n}\left(hi\times\sqrt{\frac{\rho i}{\rho 0}}\right). \quad (1)$$

The pitch of the grating electrodes 16 may be different between the IDT 21 and the reflector 22 by 10% or less, preferably 5% or less. In addition, the pitch may be different among the grating electrodes 16 by 10% or less, preferably 5% or less. In this case, even when any pitch in the grating electrode 16 is used as λ for h/λ, the error in h/λ is 10% or less or 5% or less, and thus hardly affects the simulation results. Alternatively, the average pitch in the grating electrodes 16 may be used as λ.

In the first embodiment and the variations thereof, the Y-cut angle of the Y-cut X-propagation lithium tantalate substrate is 5° or greater and 18° or less. The grating electrode 16 is located on the piezoelectric substrate 10 that is a lithium tantalate substrate, uses the SH-type oscillation mode as a primary mode, and excites the acoustic wave of which the acoustic velocity is lower than the acoustic velocity of Rayleigh mode spurious. This configuration makes the SH wave slower than the Rayleigh wave as illustrated in FIG. 4A through FIG. 10B. Therefore, the pitch of the grating electrodes 16 can be made to be small, and thereby, the size of the acoustic wave resonator can be reduced. In addition, as illustrated in FIG. 12, appropriate selection of the film thickness of the metal film 12 reduces the Rayleigh mode spurious. The Y-cut angle is preferably 6° or greater, more preferably 7° or greater, further preferably 8° or greater. The Y-cut angle is preferably 16° or less, more preferably 15° or less.

In addition, the grating electrode 16 meets the following condition $$0.16\lambda \le \sum_{i=1}^{n}\left(hi\times\sqrt{\frac{\rho i}{\rho 0}}\right) \le 0.24\lambda. \quad (2)$$

Satisfaction of this condition reduces Rayleigh mode spurious is reduced as illustrated in FIG. 12. The normalized film thickness is preferably 0.17λ or greater, more preferably 0.18λ or greater, further preferably 0.20λ or greater. The normalized film thickness is preferably 0.22λ or less, more preferably 0.20λ or less.

As illustrated in FIG. 11, when the cut angle is 5.5° or greater and 7.5° or less, the grating electrode 16 preferably meets the following condition $$0.22\lambda \le \sum_{i=1}^{n}\left(hi\times\sqrt{\frac{\rho i}{\rho 0}}\right) \le 0.24\lambda. \quad (3)$$

When the cut angle is 7.5° or greater and 10.5° or less, the grating electrode 16 preferably meets the following condition $$0.20\lambda \le \sum_{i=1}^{n}\left(hi\times\sqrt{\frac{\rho i}{\rho 0}}\right) \le 0.24\lambda. \quad (4)$$

When the cut angle is 10.5° or greater and 12° or less, the grating electrode 16 preferably meets the following condition $$0.18\lambda \le \sum_{i=1}^{n}\left(hi\times\sqrt{\frac{\rho i}{\rho 0}}\right) \le 0.24\lambda. \quad (5)$$

When the cut angle is 12° or greater and 14° or less, the grating electrode 16 preferably meets the following condition $$0.17\lambda \leq \sum_{i=1}^{n} \left( hi \times \sqrt{\frac{\rho i}{\rho 0}} \right) \leq 0.24\lambda. \quad (6)$$

When the cut angle is 14° or greater and 16° or less, the grating electrode 16 preferably meets the following condition $$0.16\lambda \leq \sum_{i=1}^{n} \left( hi \times \sqrt{\frac{\rho i}{\rho 0}} \right) \leq 0.20\lambda. \quad (7)$$

When the cut angle is 16° or greater and 19° or less, the grating electrode 16 preferably meets the following condition $$0.16\lambda \leq \sum_{i=1}^{n} \left( hi \times \sqrt{\frac{\rho i}{\rho 0}} \right) \leq 0.17\lambda. \quad (8)$$

As illustrated in FIG. 12, when the cut angle is 7.5° or greater and 9° or less, the grating electrode 16 preferably meets the following condition $$0.22\lambda \leq \sum_{i=1}^{n} \left( hi \times \sqrt{\frac{\rho i}{\rho 0}} \right) \leq 0.24\lambda. \quad (9)$$

When the cut angle is 9° or greater and 11° or less, the grating electrode 16 preferably meets the following condition $$0.20\lambda \leq \sum_{i=1}^{n} \left( hi \times \sqrt{\frac{\rho i}{\rho 0}} \right) \leq 0.24\lambda. \quad (10)$$

When the cut angle is 11° or greater and 13° or less, the grating electrode 16 preferably meets the following condition $$0.18\lambda \leq \sum_{i=1}^{n} \left( hi \times \sqrt{\frac{\rho i}{\rho 0}} \right) \leq 0.20\lambda. \quad (11)$$

When the cut angle is 13° or greater and 15.5° or less, the grating electrode 16 preferably meets the following condition $$0.17\lambda \leq \sum_{i=1}^{n} \left( hi \times \sqrt{\frac{\rho i}{\rho 0}} \right) \leq 0.18\lambda. \quad (12)$$

As illustrated in FIG. 13, when the cut angle is 8° or greater and 10° or less, the grating electrode 16 preferably meets the following condition $$0.22\lambda \leq \sum_{i=1}^{n} \left( hi \times \sqrt{\frac{\rho i}{\rho 0}} \right) \leq 0.24\lambda. \quad (13)$$

When the cut angle is 10° or greater and 11° or less, the grating electrode 16 preferably meets the following condition $$0.20\lambda \leq \sum_{i=1}^{n} \left( hi \times \sqrt{\frac{\rho i}{\rho 0}} \right) \leq 0.22\lambda. \quad (14)$$

When the cut angle is 13.5° or greater and 15° or less, the grating electrode 16 preferably meets the following condition $$0.17\lambda \leq \sum_{i=1}^{n} \left( hi \times \sqrt{\frac{\rho i}{\rho 0}} \right) \leq 0.18\lambda. \quad (15)$$

One or more metal films are mainly composed of at least one of copper (Cu), tungsten (W), Ru, Mo, tantalum (Ta), platinum (Pt), palladium (Pd), iridium (Ir), Rh, rhenium (Re), and tellurium (Te). Since these metal films have large densities, even when the metal film is thin, the normalized film thickness can be made to be large as expressed by the formula (1). The statement "a film is mainly composed of a certain element" means that the film contains the certain element to the extent that the advantage of the first embodiment and the variations thereof is achieved. For example, the certain element of 50 atomic % or greater (or, for example, 90 atomic % or greater) is contained.

As in the second variation of the first embodiment, the adhesion layer 17 may be located between the metal film 12 and the piezoelectric substrate 10. In addition, an additional film may be located on the metal film 12 and/or in the metal film. The adhesion layer 17 and the additional film can be made of, for example, aluminum (Al), nickel (Ni), or Ni—Cr (nichrome) instead of Ti and Cr. In the case where the adhesion layer 17 and the additional film have smaller densities than the metal film 12 and are thinner than the metal film 12, the adhesion layer 17 and the additional film may be ignored when the formula (1) is calculated. Alternatively, when the formula (1) is calculated, the adhesion layer 17 and the additional film may be assumed to be the films in the metal film 12.

Second Embodiment

A second embodiment is an exemplary filter. As illustrated in FIG. 2, the acoustic wave resonator of any one of the first embodiment and the variations thereof may be used in the ladder-type filter. In addition, the acoustic wave resonator of any one of the first embodiment and the variations thereof may be used in the multimode type filter.

First Variation of the Second Embodiment

Figure 17:
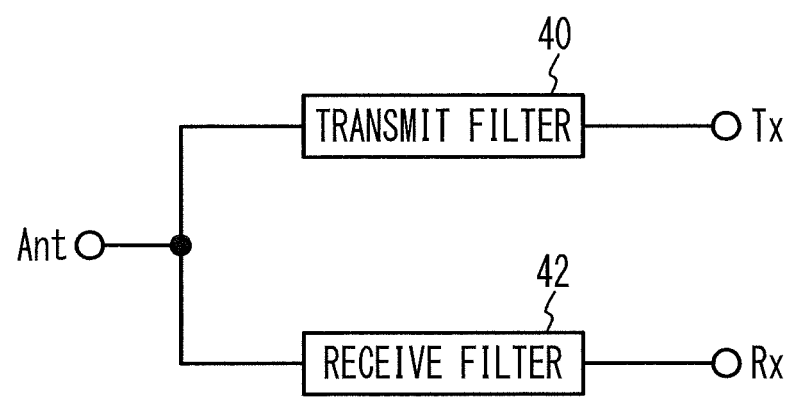
FIG. 17 is a block diagram of a duplexer in accordance with a first variation of the second embodiment.

FIG. 17 is a block diagram of a duplexer in accordance with a first variation of the second embodiment. As illustrated in FIG. 17, a transmit filter 40 is connected between a common terminal Ant and a transmit terminal Tx. The transmit filter 40 outputs signals in the transmit band to the common terminal Ant as transmission signals among high-frequency signals input to the transmit terminal Tx, and suppresses signals with other frequencies. A receive filter 42 is connected between the common terminal Ant and a receive terminal Rx. The receive filter 42 outputs signals in the receive band to the receive terminal Rx as reception signals among high-frequency signals input to the common terminal Ant, and suppresses signals with other frequencies. The filter of the second embodiment can be used for at least one of the transmit filter 40 and the receive filter 42. A duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a Y-cut X-propagation lithium tantalate substrate having a cut angle of 5° or greater and 19° or less; and
a grating electrode that is formed of one or more metal films stacked on the lithium tantalate substrate, a number of the one or more metal films being n (n is a natural number), excites an acoustic wave, and meets a condition:

$$0.16\lambda \leq \sum_{i=1}^{n} \left( hi \times \sqrt{\frac{\rho i}{\rho 0}} \right) \leq 0.24\lambda$$

where $\rho i$ represents a density of each metal film of the one or more metal films, $hi$ represents a film thickness of the each metal film, $\rho 0$ represents a density of Mo, and $\lambda$ represents a pitch.

2. The acoustic wave device according to claim 1, wherein the cut angle is 5.5° or greater and 7.5° or less, and the grating electrode meets a condition:

$$0.22\lambda \leq \sum_{i=1}^{n} \left( hi \times \sqrt{\frac{\rho i}{\rho 0}} \right) \leq 0.24\lambda.$$

3. The acoustic wave device according to claim 1, wherein the cut angle is 7.5° or greater and 10.5° or less, and the grating electrode meets a condition:

$$0.20\lambda \leq \sum_{i=1}^{n} \left( hi \times \sqrt{\frac{\rho i}{\rho 0}} \right) \leq 0.24\lambda.$$

4. The acoustic wave device according to claim 1, wherein the cut angle is 10.5° or greater and 12° or less, and the grating electrode meets a condition:

$$0.18\lambda \leq \sum_{i=1}^{n} \left( hi \times \sqrt{\frac{\rho i}{\rho 0}} \right) \leq 0.24\lambda.$$

5. The acoustic wave device according to claim 1, wherein the cut angle is 12° or greater and 14° or less, and the grating electrode meets a condition:

$$0.17\lambda \leq \sum_{i=1}^{n} \left( hi \times \sqrt{\frac{\rho i}{\rho 0}} \right) \leq 0.24\lambda.$$

6. The acoustic wave device according to claim 1, wherein the cut angle is 14° or greater and 16° or less, and the grating electrode meets a condition:

$$0.16\lambda \leq \sum_{i=1}^{n} \left( hi \times \sqrt{\frac{\rho i}{\rho 0}} \right) \leq 0.20\lambda.$$

7. The acoustic wave device according to claim 1, wherein the cut angle is 16° or greater and 19° or less, and the grating electrode meets a condition:

$$0.16\lambda \leq \sum_{i=1}^{n} \left( hi \times \sqrt{\frac{\rho i}{\rho 0}} \right) \leq 0.17\lambda.$$

8. The acoustic wave device according to claim 1, wherein
a primary mode of the acoustic wave is an SH-type oscillation mode, and
an acoustic velocity of the acoustic wave is lower than an acoustic velocity of Rayleigh mode spurious.

9. The acoustic wave device according to claim 2, wherein the one or more metal films include a metal film mainly composed of at least one of Cu, W, Ru, Mo, Ta, Pt, Pd, Ir, Rh, Re, and Te.

10. An acoustic wave device comprising:
a Y-cut X-propagation lithium tantalate substrate having a cut angle of 5° or greater and 18° or less, and
a grating electrode that is located on the lithium tantalate substrate, and excites an acoustic wave, a primary mode of the acoustic wave being an SH-type oscillation mode, an acoustic velocity of the acoustic wave being lower than an acoustic velocity of Rayleigh mode spurious.

11. A filter comprising
the acoustic wave device according to claim 1.

12. A multiplexer comprising
the filter according to claim 11.

13. A filter comprising
the acoustic wave device according to claim 10.

14. A multiplexer comprising
the filter according to claim 13.

* * * * *